(12) United States Patent
Steinbeck

(10) Patent No.: US 11,469,222 B2
(45) Date of Patent: Oct. 11, 2022

(54) ESD-PROTECTION DEVICE AND MOS-TRANSISTOR HAVING AT LEAST ONE INTEGRATED ESD-PROTECTION DEVICE

(71) Applicant: X-FAB Semiconductor Foundries GmbH, Erfurt (DE)

(72) Inventor: Lutz Steinbeck, Dresden (DE)

(73) Assignee: X-FAB Semiconductor Foundries GmbH, Erfurt (DE)

( * ) Notice: Subject to any disclaimer, the term of this patent is extended or adjusted under 35 U.S.C. 154(b) by 0 days.

(21) Appl. No.: 16/834,680

(22) Filed: Mar. 30, 2020

(65) Prior Publication Data

US 2020/0388607 A1 Dec. 10, 2020

(30) Foreign Application Priority Data

Mar. 29, 2019 (DE) ...................... 10 2019 108 334.6

(51) Int. Cl.
*H01L 27/02* (2006.01)
(52) U.S. Cl.
CPC .................................. *H01L 27/0262* (2013.01)
(58) Field of Classification Search
CPC ............... H01L 27/0262; H01L 27/027; H01L 29/1095; H01L 29/42368; H01L 29/7817; H01L 29/0839; H01L 29/7404; H01L 29/66363; H01L 29/063; H01L 29/0649; H01L 29/749
See application file for complete search history.

(56) References Cited

U.S. PATENT DOCUMENTS

2007/0284665 A1* 12/2007 Nagai ..................... H01L 29/87
257/357
2019/0312026 A1* 10/2019 Zhan ..................... H02H 9/046

* cited by examiner

*Primary Examiner* — Stephen M Bradley
*Assistant Examiner* — Wasiul Haider
(74) *Attorney, Agent, or Firm* — Greenberg Traurig LLP

(57) ABSTRACT

Protection against electrostatic discharges is to be improved for electronic devices, or is to be provided in the first place. The device for protection against electrostatic discharges having an integrated semiconductor protection device comprises an inner region (1) configured at least as a thyristor (SCR) and at least one outer region (2a, 2b) configured as a corner region, which is formed and configured at least as a PNP transistor. The inner region (1) and the at least one outer region (2a, 2b) are arranged adjacent to one another.

18 Claims, 11 Drawing Sheets

Fig. 1 (Prior Art)
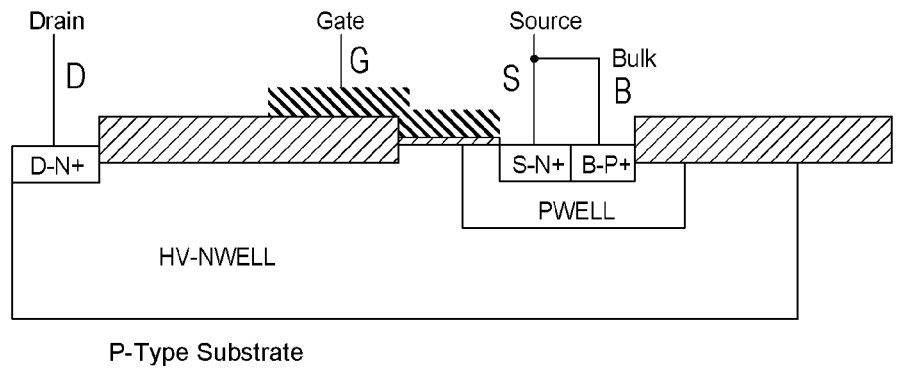
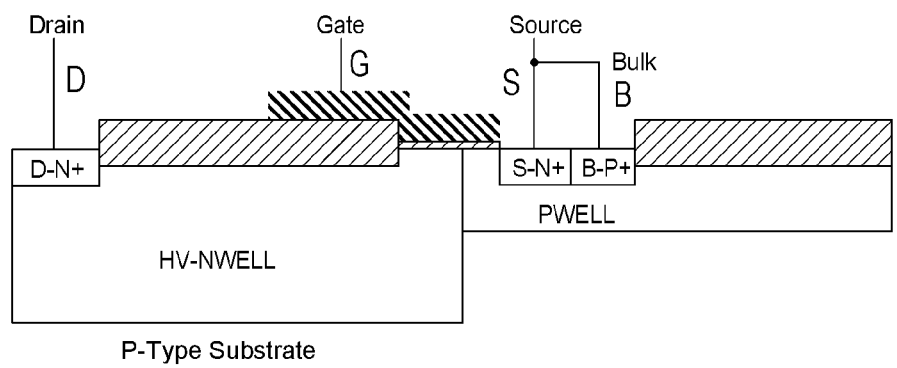
Fig. 2 (Prior Art)
Fig. 3 (Prior Art)
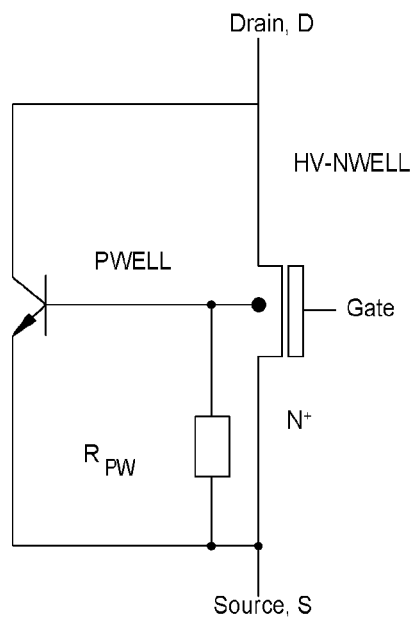

Fig. 4 (Prior Art)
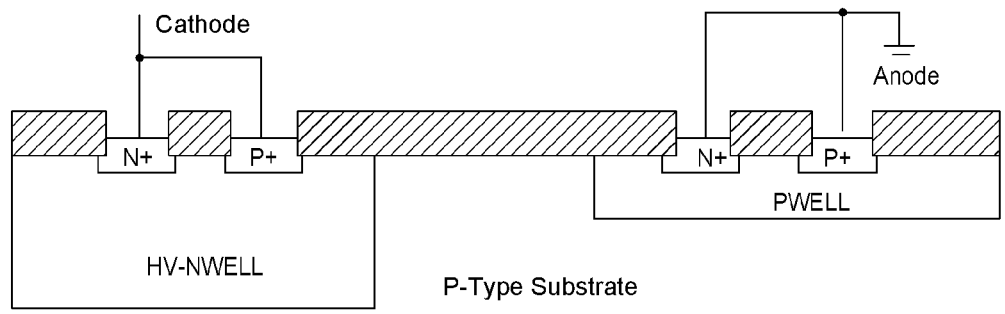
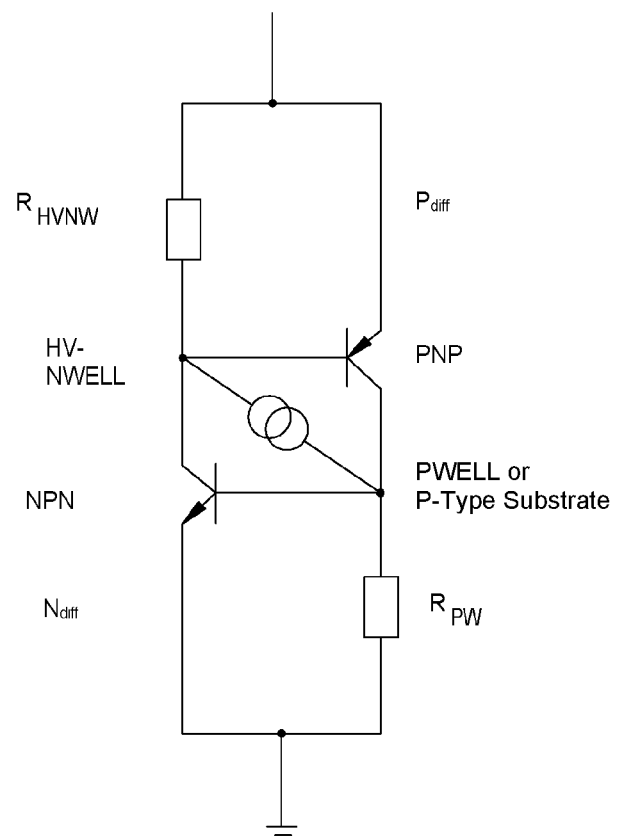
Fig. 5 (Prior Art)

Fig. 6 (Prior Art)
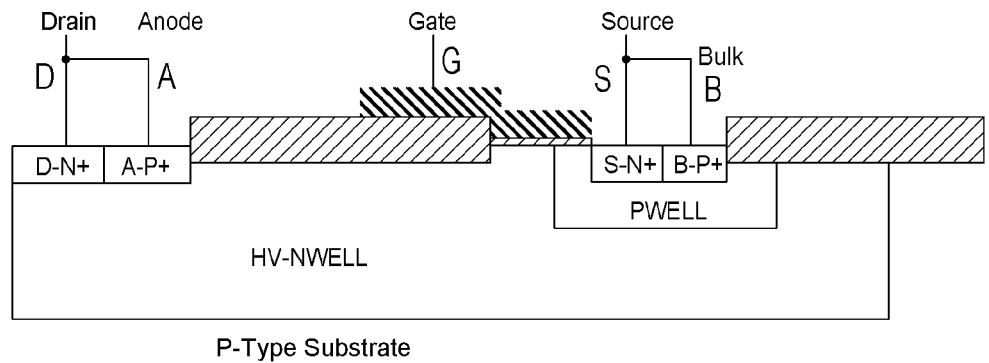
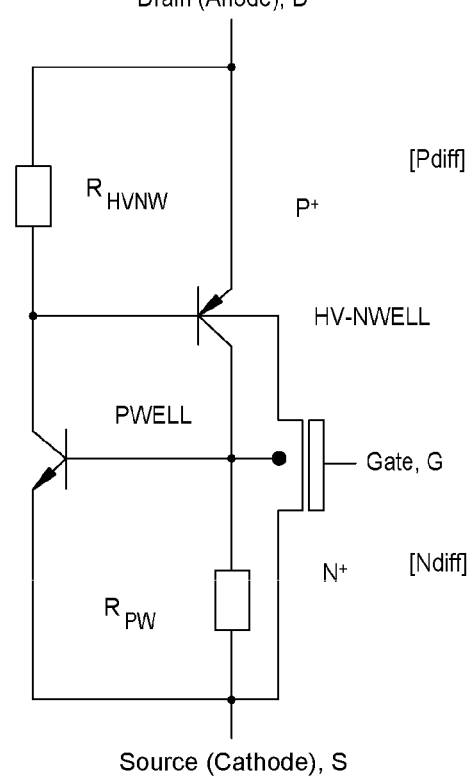
Fig. 7 (Prior Art)

Fig. 8
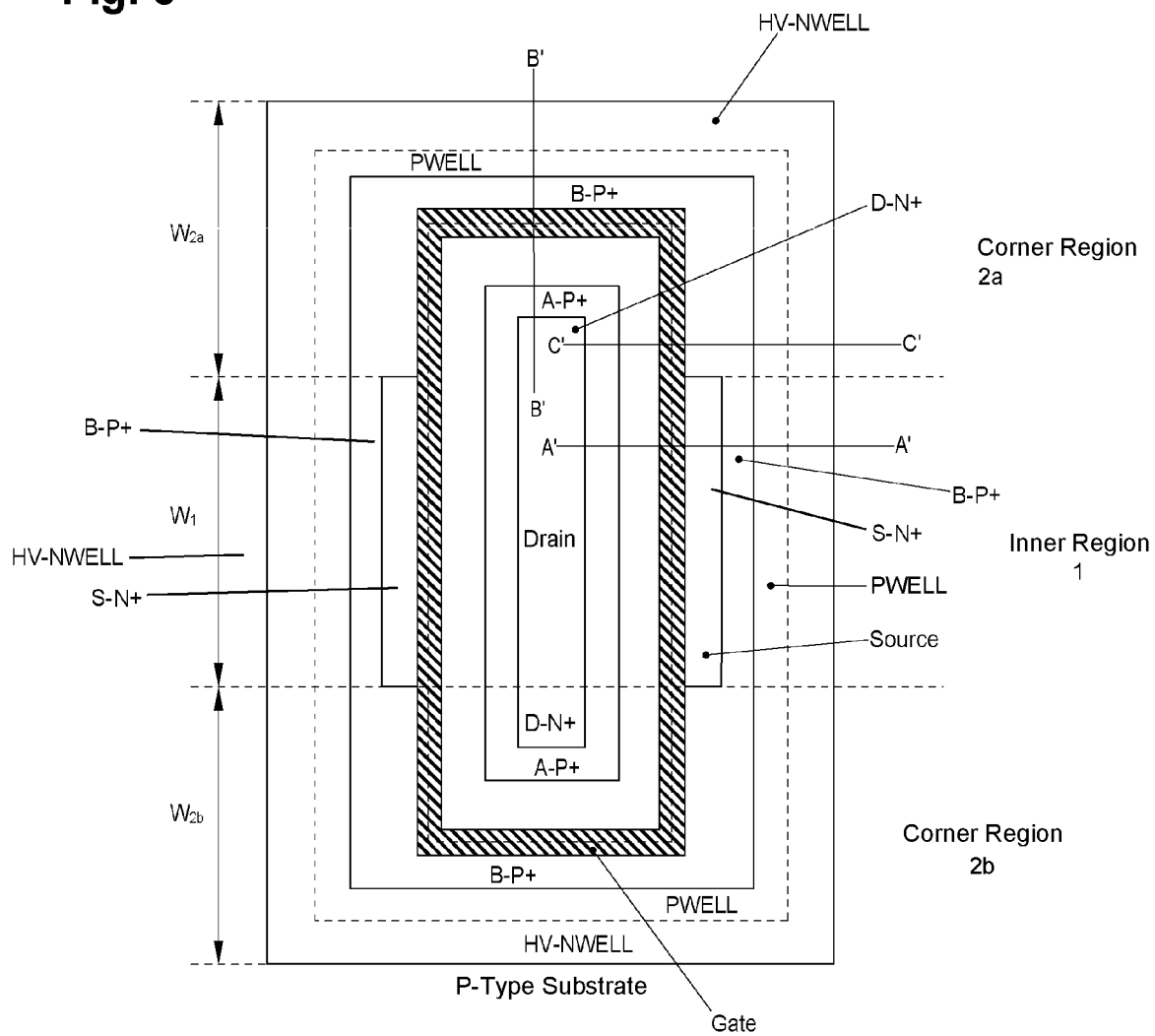
Section C' – C'
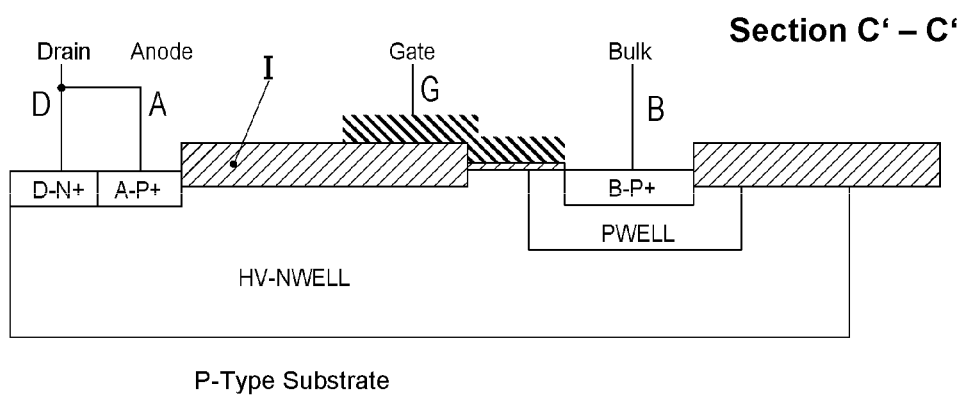
Fig. 9

Fig. 10
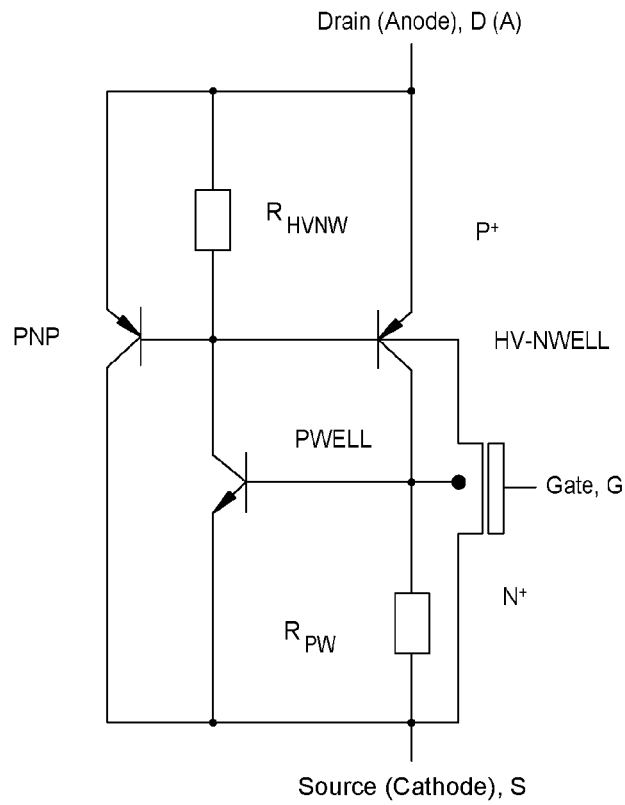
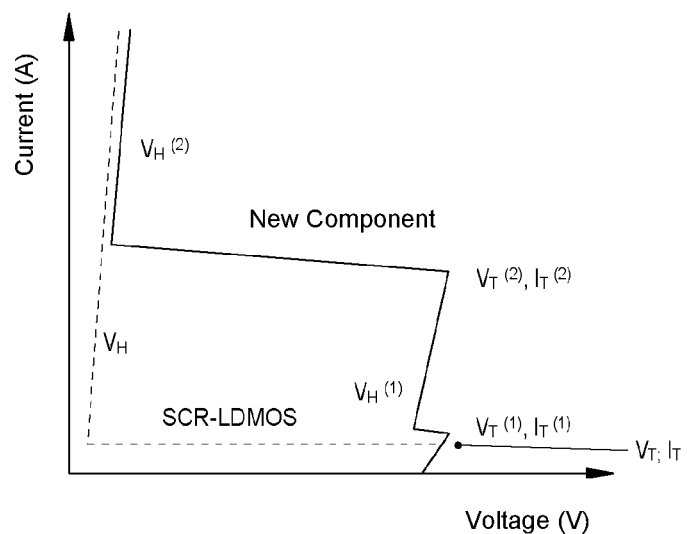
Fig. 11

Fig. 12
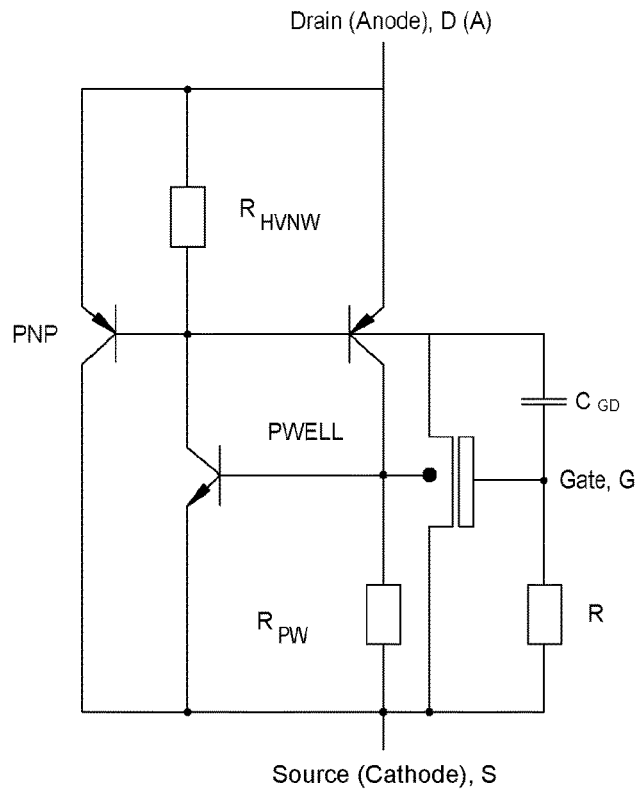
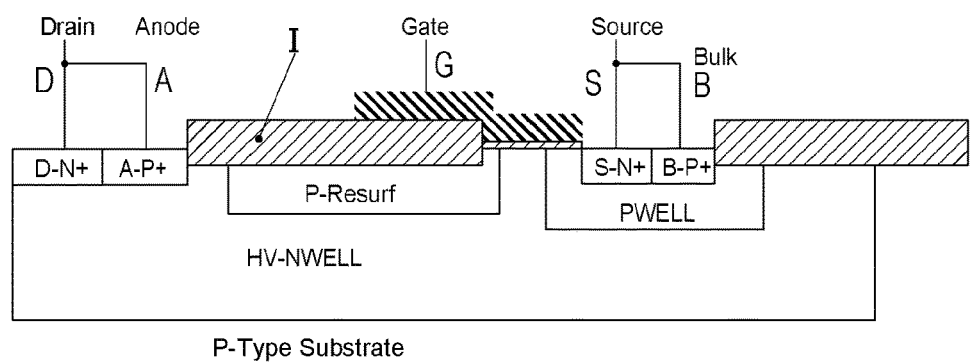
Fig. 13
Section A' – A'

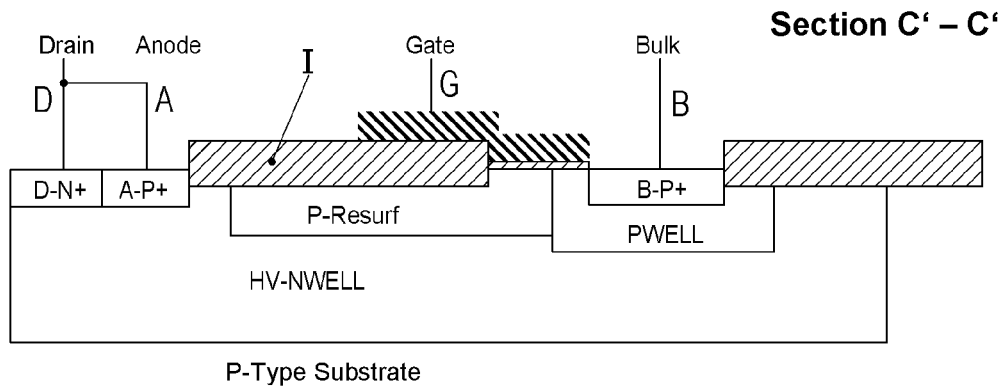
Fig. 14
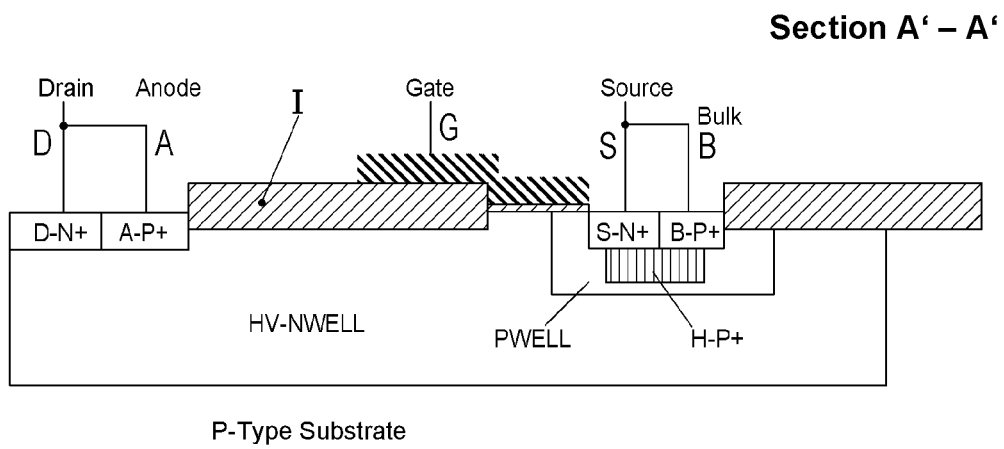
Fig. 15
Fig. 16
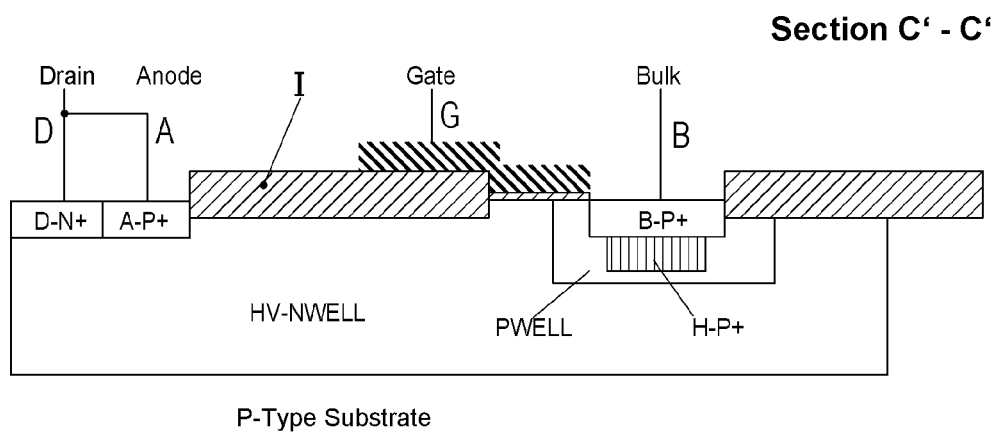

Section A' – A'

Section C' – C'

Section A' – A'

Section C' – C'
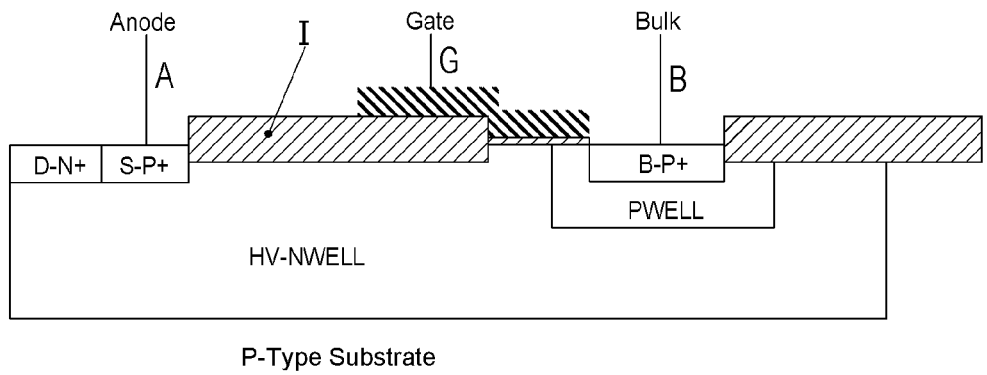
Fig. 20
Fig. 21
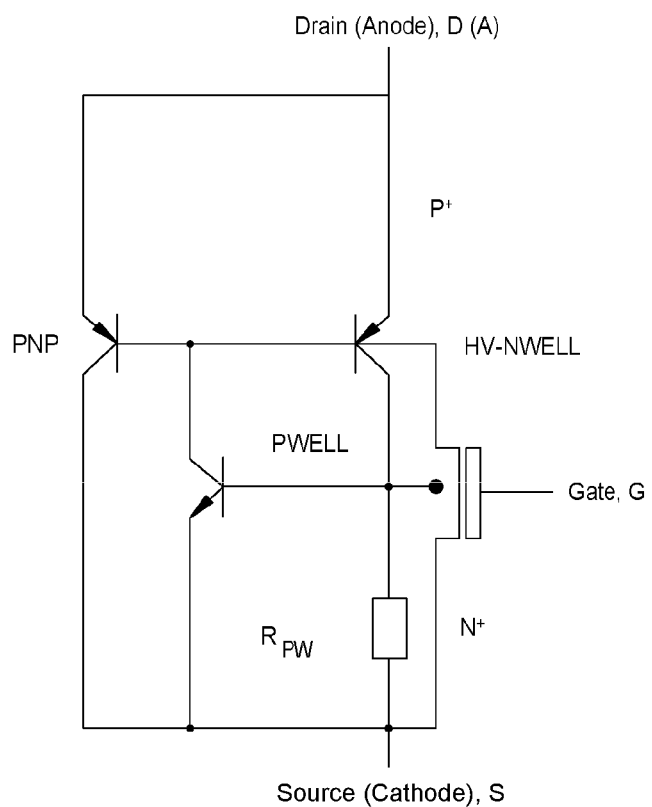

Section C' – C'

ESD-PROTECTION DEVICE AND MOS-TRANSISTOR HAVING AT LEAST ONE INTEGRATED ESD-PROTECTION DEVICE

The present disclosure (and the claims) relate to a high-voltage device, in particular a semiconductor protection device for protection against electrostatic discharges or an MOS transistor, preferably a lateral N-channel DMOS transistor (NLDMOS) or an NMOS transistor, with an integrated semiconductor protection device.

Integrated ultra-high voltage (HV) MOS transistors for voltage ranges from about 400V to 800V, which are required for 110V or 230V mains applications, e.g. for LED drivers, are generally sensitive to loads caused by electrostatic discharge (ESD stands for electrostatic discharge). This applies especially to HV-NLDMOS transistors (according to FIG. 1) and lateral HV-NMOS transistors having a drain extension region (according to FIG. 2) in HV-CMOS processes, where an ESD pulse (interference pulse) at the drain usually ignites the parasitic bipolar transistor (according to FIG. 3), as can be seen from a voltage snapback. The base-emitter junction of the parasitic bipolar transistor is here switched on by the voltage drop across the bulk resistor $R_{PW}$ as a result of a hole current generated at the pn junction between the bulk region and the drain extension region either by impact ionization or by a dV/dt displacement current. Uneven triggering and inhomogeneous current distribution during bipolar operation will then typically quickly lead to damage by a local thermal breakdown. It follows that, at least for higher demands on the ESD resistance, a parallel-connected ESD protection device is usually required, which switches on in time and discharges the ESD pulse before damage will be caused to the HV transistor.

Common ESD protection devices are, for example, thyristor devices of the type shown in FIGS. 4 and 5. A thyristor (or SCR—Silicon Controlled Rectifier, also known as a four-layer diode) can be regarded as a combination of an NPN and a PNP transistor. In cases of use as an ESD protection device, either the NPN or the PNP is switched on by a pn breakdown, a dV/dt-displacement current or an external trigger circuit. The collector current of this transistor switched on first will then switch on the respective other transistor and a state will be reached in which the NPN and PNP transistors mutually keep each other in a switched-on state. In this case, the low-doped base regions of both transistors are flooded with charge carriers (conductivity modulation). In this switched-on state, SCR devices have a low holding voltage and a low resistance and an inhomogeneous current distribution is not likely to occur. Thus, a high ESD strength per width can be achieved, usually expressed as failure voltage per width (in V/μm) or per area (in V/μm$^2$) according to the Human Body Model (HBM) or as failure current per width (in mA/μm) or per area (in mA/μm$^2$) measured with 100 ns current pulses by means of TLP (Transmission Line Pulsing). Typical values are in the range from 30 to 60 mA/um for thyristor devices with voltage ranges of up to about 100V. On the other hand, due to the often low trigger current and the low holding voltage, there is a risk of ignition of the SCR by interference pulses during operation, and this may lead to disturbances of the circuit function or, in extreme cases, cause permanent damage to the circuit (latch-up). Measures to reduce this risk comprise e.g. increasing the holding voltage by means of suitable changes in process and layout or stacking of a plurality of thyristors or increasing the trigger current by using a two-stage ESD protection circuit or a dynamic trigger circuit, which will switch on the thyristor only in the event of ESD. However, the effectiveness of these measures is limited, in particular in bulk CMOS processes.

Also known, in particular for voltage ranges of up to about 100V, is a device, which is derived from an NLDMOS and in which a Pdiff region (also P+ region) is arranged close to the drain connection region acting as PNP emitter or anode of a thyristor, shown in FIGS. 6 and 7. Such a device is usually referred to as an SCR-LDMOS. As an ESD protection device, it can protect a parallel-connected NLDMOS.

The above-mentioned drawbacks of a thyristor with respect to triggering by interference pulses and the risk of latch-up also occur in connection with the SCR-LDMOS and are not or not sufficiently remedied by the modifications mentioned. Moreover, in ultra HV-MOS transistors for voltage ranges from about 400V to 800V, the distance between the maximum permissible drain voltage of the HV-NMOS or HV-NLDMOS and the breakdown voltage and trigger voltage, respectively, of the parasitic bipolar transistor (at which the device will be damaged) is generally quite small, which makes protection by a parallel-connected ESD protection device more difficult. For an ESD protection device that is statically triggered, i.e. the trigger current is generated by a PN breakdown, both the breakdown voltage and the trigger voltage must be within this ESD design window, including process tolerances. This is often impossible with a small ESD design window.

There is a need to improve, or provide in the first place, protection against electrical interference pulses, especially electrostatic discharges, in electronic devices.

This object is achieved by a semiconductor protection device or an MOS transistor with an integrated semiconductor protection device. According to an embodiment the device for protection against electrostatic discharges is provided with an integrated semiconductor protection device, comprising an inner region configured at least as a thyristor (SCR);

at least one outer region configured at least as a PNP transistor and adapted to protect against electrostatic discharges (ESD), the inner region and the at least one outer region being arranged adjacent to one another.

The outer region is preferably configured as a corner region.

A production method for such a device achieves the same object.

An example is a method of producing a device or an MOS transistor with protection against electrostatic discharges and with an integrated semiconductor protection device, the device comprising an inner region configured at least as a thyristor (SCR);

at least one outer region configured at least as a PNP transistor and adapted to protect against electrostatic discharges (ESD), the inner region (1) and the at least one outer region (2a, 2b) being arranged adjacent to one another, wherein the production method according to the example comprises arranging on a p-type substrate at least one first N-well and arranging further sections by producing respective center-symmetrical paths and layers.

The outer region may be a corner region.

According to a further example, the device according to the present invention comprises an inner region configured at least as a thyristor (SCR), and at least one outer region, in particular a corner region, configured at least as a PNP transistor and adapted to protect against electrostatic discharges (ESD), the inner region and the at least one outer region being arranged in juxtaposition or adjacent to one another.

The method according to the present invention used for producing a semiconductor protection device or an MOS transistor according to the present invention comprises arranging on a p-type substrate at least one first N-well and arranging further sections by producing respective center-symmetrical paths and layers.

A floating connection (n.c.) in the sense of the present invention, in particular a floating drain or a floating anode, is not conductively connected to any external potential.

A main axis in the sense of the present invention may be a mirror axis of a three-dimensional body, in particular of a section according to the present invention.

A section in the sense of the present invention is a part of the inner or outer region, which extends three-dimensionally and especially comprises a semiconductor material.

A width of the outer region may be larger in the longitudinal direction of the device than the equally directed direction of extension of the inner region.

An advantage of the device described here is that, due to the effect of the PNP transistor integrated in the device as a first ESD protection stage in the outer region, the SCR trigger current can greatly be increased, without the trigger voltage of the device increasing excessively. This allows use as an ESD protection device—also with dynamic triggering—while considerably reducing the risk of triggering by interference pulses and the risk of latch-up.

Also another ESD function is accomplished by the PNP transistor located in at least one corner region and the thyristor located in the inner region. On the one hand, the PNP transistor prevents the formation of a parasitic NPN transistor or of a thyristor in the at least one corner region, which would otherwise lead to high current densities and resultant thermal damage due to premature triggering in this region. On the other hand, the PNP transistor triggers before the thyristor (SCR) in the inner region and thus acts as a first ESD protection stage having an inreased holding voltage in the function process due to the low snapback that is typical of PNP transistors. Preferably, the holding voltage is higher than half the trigger voltage of the function.

The collector current of the PNP transistor in the outer region does not contribute to the triggering of the NPN transistor in the inner region. Even after the NPN transistor has been switched on in the inner region, the charge carrier concentration required for conductivity modulation and, consequently, the ignition of the thyristor (SCR) provided in the inner region will not be reached in the inner region, if the PNP collector current component is large in the corner region(s). This means that the low holding voltage typical of thyristors are reached only at higher currents, in particular at 200 mA, 300 mA or more than 400 mA.

According to an advantageous embodiment of the device disclosed by the present invention, sections of the at least one inner region and sections of the at least one outer region, each consisting of semiconductor materials, are oriented parallel to one another substantially in the direction of their longer main axis.

This allows the whole device to be produced in one production process. Furthermore, the individual sections of the outer region and of the inner region, as far as they are identical, can be configured as a single unit. Contacting by external conductors will thus be superfluous. Last but not least, this arrangement is particularly space-saving.

According to a further advantageous embodiment of the device disclosed by the present invention, the inner region may comprise the sections following hereinafter.

At least one first n-doped region adapted to have connected thereto at least one drain; at least one first p-doped region arranged next to the at least one first n-doped region and adapted to have connected thereto at least one anode, the at least one first p-doped region being arranged at the at least first n-doped region according to a preferred embodiment.

According to a further advantageous embodiment of the device disclosed by the present invention, the inner region may comprise at least one first N-well having arranged therein the first n-doped region and the at least one first p-doped region.

According to a further advantageous embodiment of the device disclosed by the present invention, the inner region may comprise the following section: a second n-doped region arranged in spaced relationship with the at least one first n-doped region and/or the at least one first p-doped region and adapted to have connected thereto a source.

According to a further advantageous embodiment of the device disclosed by the present invention, the inner region may comprise the following section: at least one second p-doped region arranged next to the at least one second n-doped region and adapted to have connected thereto a bulk, the at least one second p-doped region being in particular arranged at the at least one second n-doped region.

According to a further advantageous embodiment of the device disclosed by the present invention, the inner region may comprise the following section: at least one P-well having arranged therein the at least one second n-doped region and the at least one second p-doped region, the at least one P-well being in particular arranged in the at least one first N-well and/or adjacent to the latter.

At least one isolation region arranged between the at least one first n-doped region and/or the at least one first p-doped region and the at least one second n-doped region may be provided, a gate being connectable above this isolation region. The isolation region may be located above the N-well (as a drain extension region). The gate may be located partially above the isolation region and partially directly above the N-well and the P-well (as a bulk region).

The thyristor may be formed in the inner region by the at least one first p-doped region, the at least one first N-well, the at least one P-well and the at least one second n-doped region.

The at least one outer region may comprise the following sections: at least one first p-doped region (adapted to have connected thereto at least one anode); at least one first N-well (having arranged therein in particular the first n-doped region and the at least one first p-doped region).

The at least one outer region may comprise the following section: at least one second p-doped region (adapted to have connected thereto a bulk); at least one P-well (having arranged therein the at least one second p-doped region). Preferably, the at least one P-well is arranged in the at least one first N-well and/or adjacent to the latter.

The at least one outer region may comprise the following section: the PNP transistor is formed in the outer region by the at least one first p-doped region, the at least one first N-well and the at least one P-well. According to an embodiment, at least one isolation region is provided, which is arranged between the at least one first n-doped region and/or the at least one first p-doped region and the at least one second p-doped region.

Due to the fact that the outer region is configured to be at least partially identical with the inner region, the production of the device is substantially simplified and individual sections can be configured as common sections in both regions.

According to a further advantageous embodiment, the at least one outer region further comprises: a second n-doped region arranged in spaced relationship with the at least one first n-doped region and/or the at least one first p-doped region (the second n-doped region being connectable to a source); at least one first n-doped region (connectable to a drain), and/or at least one isolation region arranged between the at least one first n-doped region and/or the at least one first p-doped region and the second n-doped region.

A gate may be arranged above the isolation region, the first p-doped region being arranged next to the at least one first n-doped region, in particular directly next to this n-type region.

According to a further advantageous embodiment of the device disclosed by the present invention, at least one section of the at least one outer region is configured as a common section with a corresponding section of the inner region.

According to a further advantageous embodiment, the device according to the present invention comprises at least one p-doped region arranged between the at least one first n-doped region and the at least one P-well, the p-doped region being in particular arranged in the at least one outer region directly at the at least one P-well and configured to act as a collector of the PNP-transistor.

According to a further advantageous embodiment, the device according to the present invention comprises a p-doped, in particular a highly doped, region arranged in the at least one P-well, this region being in particular arranged below the at least one second p-doped region. The p-doped region may preferably be a region doped with a concentration of $10^{13}/cm^2$ to $10^{14}/cm^2$ and it may in particular be arranged below the at least one second p-doped region.

According to a further advantageous embodiment of the device disclosed by the present invention, the at least one first n-doped region and/or the at least one first p-doped region is/are arranged in at least one second N-well, which is in particular arranged in the at least one first N-well and which has in particular a higher doping concentration than the at least one first N-well.

The at least one first n-doped region (D-N+, D-N+) and/or the at least one first p-doped region (A-P+, A-P+) may be arranged in the second N-well (NWELL, NWELL), which is arranged in a first N-well (HV-NWELL, HV-NWELL). The second N-well may have a higher doping concentration than the at least one first N-well (HV-NWELL).

According to a further advantageous embodiment, the device according to the present invention comprises two respective source regions and two respective second n-doped regions. Preferably, the device comprises only a respective single one of all the other sections and/or all the sections of the device are arranged or configured in a center-symmetrical, in particular convex manner.

As regards all the other sections, the device may comprise only a respective single one of them.

All the sections may be arranged or configured in a center-symmetrical manner.

According to a further advantageous embodiment of the device according to the present invention, the inner region is arranged between two outer regions. This is particularly advantageous as regards space utilization, since a semiconductor protection device of high efficiency with large PNP transistor regions is created. It will be able to dissipate high currents without damage being caused.

According to a further advantageous embodiment of the device according to the present invention, in particular of the semiconductor protection device according to the present invention, the at least one first n-doped region is configured as a region with a floating potential (n.c.).

According to a further advantageous embodiment of the device according to the present invention, in particular of the MOS transistor according to the present invention, the MOS transistor is configured as a depletion field effect transistor.

According to a further advantageous embodiment of the device according to the present invention, a resistor is connected between the gate and the source, the resistor having preferably a resistance that is equal to or higher than 10 kΩ, and particularly preferred it has a variable resistance (in the sense of variability). This serves the purpose of dynamic triggering with capacitive gate coupling.

According to a further advantageous embodiment of the device according to the present invention, the bulk and the source and/or the drain and the anode are short-circuited.

Features of different embodiments are not limited to these embodiments, but can be combined with one another in an advantageous manner.

The embodiments of the present invention are described on the basis of examples and they are not described in a way allowing limitations to be transferred from the figures into the claims or to be read into the claims. Like reference numerals in the figures stand for like elements.

FIG. 1 is an integrated HV-NLDMOS transistor according to the prior art;

FIG. 2 shows an integrated HV-NMOS transistor according to the prior art;

FIG. 3 is an equivalent circuit diagram of the HV-NLDMOS transistor of FIG. 1;

FIG. 4 is an integrated HV-ESD protection device configured as a silicon controlled rectifier or thyristor (aka SCR) for integrated high-voltage MOS transistors in CMOS circuits according to the prior art;

FIG. 5 is an equivalent circuit diagram of the protection device of FIG. 4.

FIG. 6 is an LDMOS transistor with integrated thyristor according to the prior art;

FIG. 7 is an equivalent circuit diagram of the device of FIG. 6.

FIG. 8 is a device according to a first embodiment of the present invention;

FIG. 9 is a section through an outer region of the device of the first embodiment according to FIG. 8;

FIG. 10 is an equivalent circuit diagram of a device according to FIG. 8;

FIG. 11 is a schematic representation of the quasi-static high current characteristic curves of the device of the first embodiment of the present invention according to FIG. 8 in comparison with the device according to FIG. 6;

FIG. 12 is an equivalent circuit diagram of the device of the first embodiment according to FIG. 8 with an external resistor R for dynamic triggering;

FIG. 13 is a section through an inner region of the device of a second embodiment of the present invention with an additional P-resurf region;

FIG. 14 is a section through an outer region of the device of the second embodiment of the present invention with an additional P-resurf region;

FIG. 15 shows a section through an inner region of the device of a third embodiment of the present invention with an additional doping of a P-well in the bulk region;

FIG. 16 shows a section through an outer region of the device of the third embodiment of the present invention with an additional doping of a P-well in the bulk area;

FIG. 20 shows a section through the outer region of the device of the fifth embodiment of the present invention;

FIG. 21 is an equivalent circuit diagram of the device of the fifth embodiment of the present invention according to FIG. 19 and FIG. 20;

Figure 17:
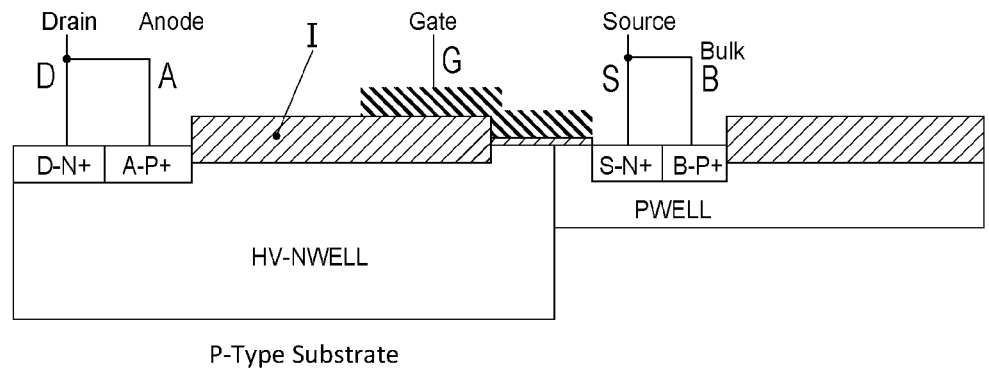
FIG. 17 shows a section through the inner region of the device of a fourth embodiment of the present invention, with a P-well of the bulk region being located in the p-type substrate.

A first embodiment of the device according to the present invention, which can be used both as a transistor with an integrated ESD protection device and as an ESD protection device alone, will be explained in more detail with reference to FIG. 8 and FIG. 9.

In the case of this embodiment, the device consists of an inner region 1 and two outer regions 2a, 2b, which are realized by corner regions. The drain region D-N+ of the transistor is preferably arranged inside, when seen in the radial direction of the device, while the source region S-N+ is preferably arranged further out. The layout of the outer regions 2a, 2b is shown in FIG. 8 in simplified form. In the real MOS device, either 45° corners or round corner terminations (a so-called racetrack layout) are preferably used for reasons of dielectric strength.

For the same reasons, the outer radius of the drain region D-N+ preferably has a certain minimum size in the corner regions 2a, 2b. Even larger drain radii occur preferably in cases where the drain region D-N+ has a bond pad integrated therein—a variant which is commonly used in UHV devices and which preferably dispenses with the use of a metal and via plane for the ultra-high voltage, in order to prevent, on the one hand, a possible reduction of the breakdown voltage due to the field plate effect of this UHV metal plane and save, on the other hand, the two mask planes required for this.

The structural design in the inner region 1 (cross-section along plane A'-A' in FIG. 8) corresponds in principle to the SCR-LDMOS in FIG. 6, i.e. it preferably comprises an Ndiff drain connection region D-N+, also referred to as first n-doped region, and a Pdiff region A-P+, also referred to as first p-doped region, which acts as anode A of a thyristor, a drain extension region HV-NWELL, also referred to as first N well, a bulk region PWELL, also referred to as P well and, within the drain extension region HV-NWELL, an Ndiff source region S-N+, also referred to as second n-doped region, and a Pdiff bulk junction region B-P+, also referred to as second p-doped region, within the bulk region PWELL. The source S and the bulk B are preferably short-circuited with each other and will therefore be referred to in the following as source S for short. The drain extension region HV-NWELL is preferably located within a P substrate.

The structural design in the outer region, in particular the corner regions 2a, 2b of the device, which are corner regions in the present embodiment (cross sections along the plane B'-B' and C'-C' of FIG. 8), cf. cross-section of FIG. 9, is preferably modified in comparison with the structural design in the inner region 1 insofar as the Ndiff source region S-N+ is missing there or is replaced by a Pdiff bulk connection region B-P+. Thus, a thyristor (SCR) is preferably only formed in the inner region 1 of the device of FIG. 8, while a PNP transistor is formed in the corner regions 2a, 2b, cf. FIG. 9, the PNP transistor comprising the Pdiff anode region A-P+ in the drain extension area HV-NWELL as an emitter, the drain extension region HV-NWELL as a base and the bulk region B-P+ as a collector.

Accordingly, the ESB of FIG. 10 of the device of FIG. 8 shows, in comparison with the ESB (equivalent circuit diagram) of FIG. 7, an additional PNP transistor integrated in the device. On the one hand, this modification prevents the formation of a parasitic NPN transistor or a thyristor (SCR) in the corner regions 2a, 2b, which, due to premature triggering in this area, could otherwise lead to a high current density and the resultant thermal damage. On the other hand, the PNP transistor triggers in the corner regions 2a, 2b prior to the thyristor (SCR) in the inner region 1 and thus acts as a first ESD protection stage having a high holding voltage $V_H^{(1)}$ due to the low snapback typical of PNP transistors. Numerical values of the holding voltage level are higher than half the trigger voltage, in particular the (first) snapback voltage of a PNP transistor.

This high holding voltage $V_H^{(1)}$ is shown as a quasi-static high current characteristic curve of the device in FIG. 11.

If the gate G of the device is short-circuited ($V_{GS}$=0) with the source S and the bulk B, the protective effect or protection of the device in the case of an ESD pulse functions (or works) as follows:

When a pn breakdown voltage between the drain extension region HV-NWELL and the bulk region PWELL has been exceeded (a breakdown typically occurs in the corner regions), this will preferably lead to an electron current being excited at the drain D in the drain extension region HV-NWELL, which electron current further preferably causes a voltage drop below the Pdiff anode region A-P+, shown as $R_{HVNW}$ in FIG. 10.

This preferably causes a voltage difference between the PNP emitter and the PNP base, which switches on the PNP transistor.

The collector current of the PNP transistor in the outer regions 2a, 2b preferably does not contribute to triggering of the NPN transistor in the inner region 1.

Even after the NPN transistor in the inner region 1 has been switched on, with a large PNP collector current component in the corner regions 2a, 2b the charge carrier concentration required for conductivity modulation in the inner region 1 and thus the ignition of the thyristor (SCR) in the inner region 1 and the thyristor-typical low holding voltage $V_H^{(2)}$ will preferably only be reached at higher currents, shown as $I_T^{(2)}$ in FIG. 11. These high currents are currents of at least 200 mA, preferably 300 mA or more than 400 mA.

This will preferably reduce the risk that the thyristor may be triggered by interference pulses and that a latch-up may result from this, because much higher currents are necessary to reach the critical state with a low holding voltage. However, such high currents will normally not be reached by interference pulses.

Since the thyristor is not triggered if interference pulses occur, dynamic triggering can be used (as triggering by capacitive gate coupling at gate G of the SCR-LDMOS and/or by the dV/dt displacement current generated by the steep rising edge of the ESD pulse). Under ESD conditions, i.e. when an interference pulse occurs, a preferably transient trigger voltage of the PNP transistor in the outer regions 2a, 2b can thus be accomplished, this trigger voltage being below the static breakdown voltage of the thyristor in the inner region 1. In addition to the PNP transistor especially in the corner regions, the PNP transistor is also active in the inner region (emitter, base and collector in the inner region and in the corner regions are not separated from one another). Instead of an ESD pulse, also an interference pulse (which occurs in the same time range) will be processed in this way.

This will be advantageous especially in cases where an ESD design window is small. The device can therefore preferably be used both as an HV-MOS transistor with an integrated ESD protection device and as a mere ESD protection device.

An ESB of the ESD protection device is shown in FIG. 12. For dynamic triggering, capacitive gate coupling by means of a resistor R (preferably in the 10 kΩ range) is here used in cooperation with the (parasitically acting) gate-drain capacitance $C_{GD}$ already comprised in the MOS transistor. Through an ESD interference pulse at the drain D, which generally has a steep edge, the voltage at the gate G is raised via the gate-drain capacitance $C_{GD}$ and the MOS transistor switches on. The current resulting therefrom at drain D causes, in turn, a voltage drop in the drain extension region HV-NWELL below the Pdiff anode region A-P+ and creates a potential difference between the emitter and the base of the PNP transistor. This potential difference causes the PNP transistor to be switched on. The trigger voltage can here preferably be set (be variable) through the magnitude of the resistance R between drain D and source S, but it also depends on the steepness of the edge of the ESD interference pulse.

A second version of the device is configured as a double resurf device according to FIGS. 13 and 14 (double resurf is a known principle for accomplishing a high breakdown voltage in combination with the lowest possible switch-on resistance for LDMOS and HVMOS transistors). The P-resurf region in the corner regions 2a, 2b is connected to the bulk region PWELL over a large area (in particular over the entire width), as can be seen in FIG. 14. The P-resurf region thus acts as the collector of the PNP transistor in the corner regions 2a, 2b. This is advantageous for the intended mode of operation of the device.

All the embodiments of the device described hereinafter apply analogously also to the double-resurf device of the second embodiment according to the present invention, which is shown in FIGS. 13 and 14.

In a third embodiment of the device according to the present invention, shown in FIGS. 15 and 16, the doping of the bulk region PWELL preferably below the Ndiff source connection region S-N+ and Pdiff bulk connection region B-P+ is increased by an additional boron implantation (in the range of $10^{13}/cm^2$ to $10^{14}/cm^2$). This embodiment will be advantageous in cases where the doping of the PWELL bulk region is so low that, due to the hole current generated by impact ionization at the blocked pn junction between the drain extension region HV-NWELL and the bulk region PWELL in the bulk region, the voltage drop across the PWELL resistor $R_{pw}$, which is shown in FIG. 10, to bulk B will become so large that the parasitic NPN transistor in the inner region 1 will switch on prior to the PNP transistor in the corner regions 2a, 2b.

As a result, on the one hand, there is a risk that damage may be caused to the device before the PNP transistor switches on at least in the corner regions 2a, 2b or the thyristor (SCR) switches on in the inner region, and, on the other hand, the intended mode of operation, viz. that at first only the PNP transistor switches on, in particular in the corner regions, will be prevented. The high p-type doping below the connection regions of the source S and the bulk B is preferably produced in the entire P-well PWELL by generating a suitable retrograde well profile, which may drop in particular towards the surface. Further preferably, the high p-type doping is produced via an additional mask level only in the connection regions of the source S and the bulk B and at a distance from the channel region of the MOS transistor in order to prevent an influence on the MOS transistor characteristics, in particular the threshold voltage. With a suitably high p-type doping below the connection regions of the source S and the bulk B, the triggering of the parasitic NPN transistor in the inner area 1 will be delayed. This allows the PNP transistor to switch on first (in the corner regions 2a, 2b) and the trigger current of the thyristor (SCR) to increase, both of which are of advantage for the mode of operation.

In the at least one P-well PWELL a doped region H-P+ is arranged, which is disposed below the at least one second p-doped region B-P+, this in section C'-C'. However, the doping concentration is lower than in the Pdiff region, where it is about $10^{15}/cm^2$.

Figure 18:
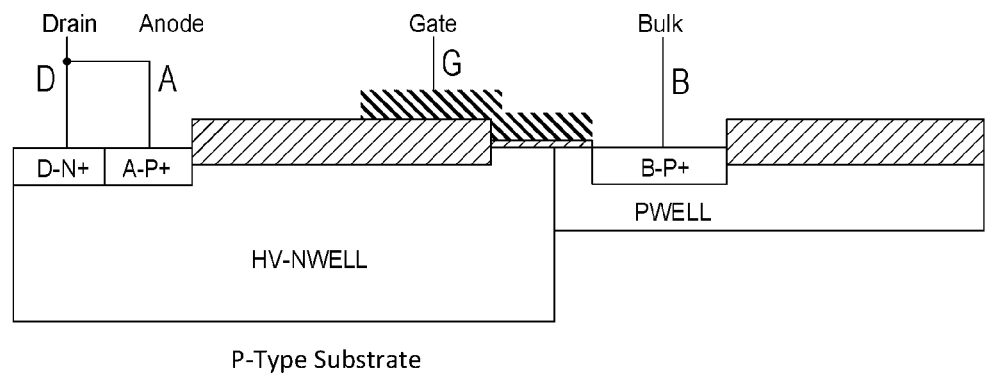
FIG. 18 shows a section through the outer region of the device of the fourth embodiment of the present invention, with a P-well of the bulk region being located in the p-type substrate.

In a fourth embodiment of the device according to the present invention, cf. FIG. 17 and FIG. 18, the bulk region PWELL is located in and/or on a p-type substrate.

Figure 19:
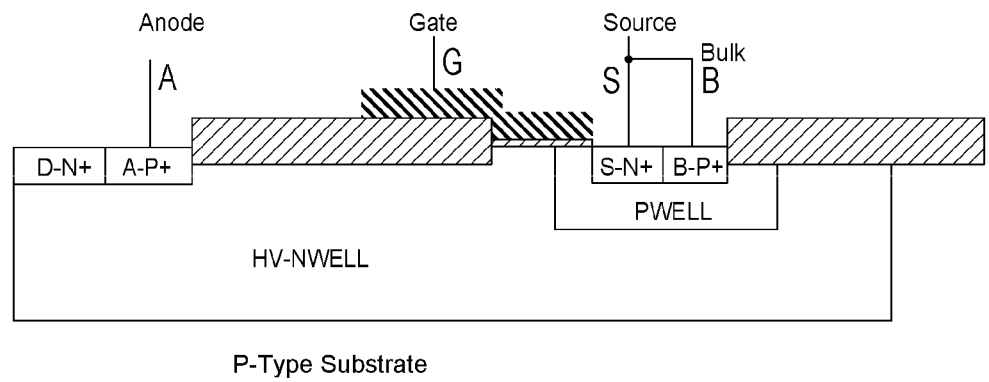
FIG. 19 shows a section through the inner region of the device of a fifth embodiment of the present invention, which is particularly suitable for use as an ESD protection device.

In a fifth embodiment of the device according to the present invention, the drain extension region HV-NWELL, i.e. the base of the PNP transistor, is configured preferably in the corner regions 2a, 2b with a floating potential, i.e. floating or n.c., as shown in FIGS. 19 and 20.

The corresponding ESB is shown in FIG. 21.

Figure 22:
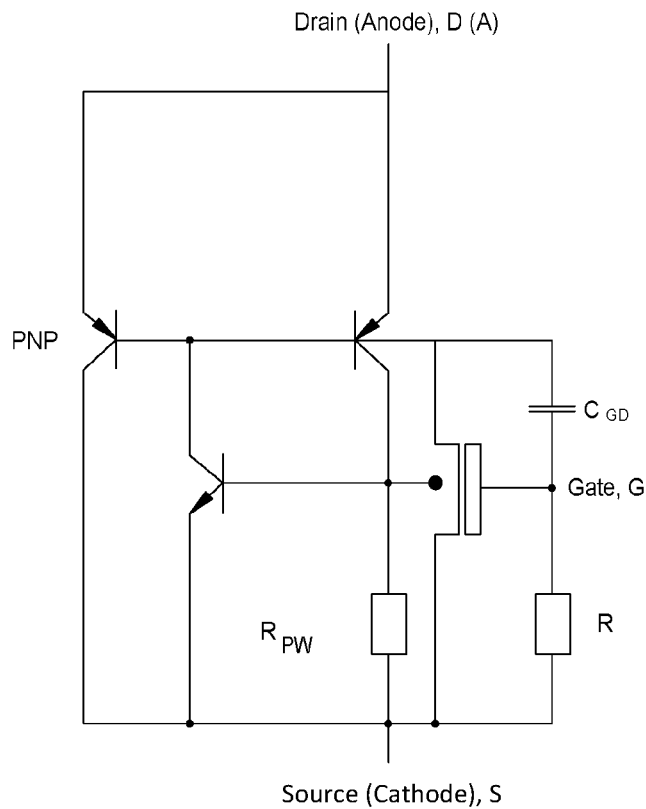
FIG. 22 is an equivalent circuit diagram of the device of the fifth embodiment of the present invention according to FIG. 19 and FIG. 20 with an external resistor.

This variant is particularly suitable for use as an ESD protection device. The PNP transistor switches on more easily with a floating base than with a base that is shorted to the emitter. Triggering is effected, as described above, by pn breakdown or by a displacement current at the junction from the bulk region PWELL to the drain extension region HV-NWELL or by switching on the gate G, e.g. by means of capacitive gate coupling. This reduces the trigger voltage and the trigger current of the PNP transistor in the corner regions 2a, 2b, and this is advantageous for applications as ESD protection device, in particular for dynamic triggering. An example of an ESB as an ESD protection device with capacitive gate coupling is shown in FIG. 22.

Figure 23:
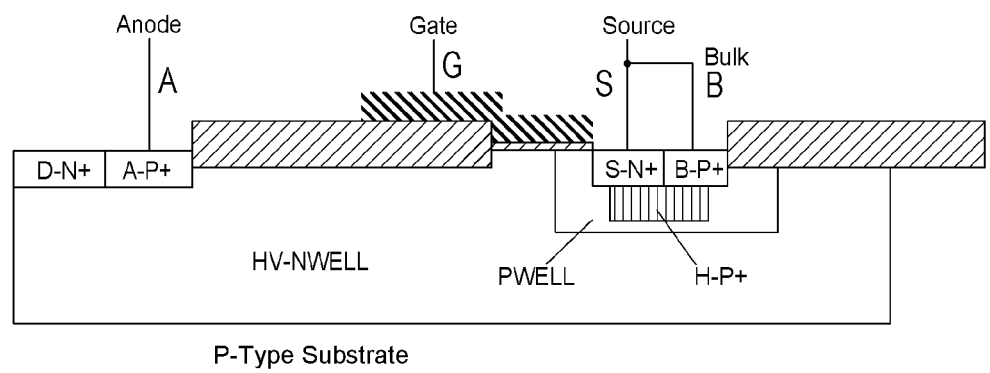
FIG. 23 shows a section through the inner region of the device of a sixth embodiment of the present invention with an additional doping of a P-well in the bulk region.
Figure 24:
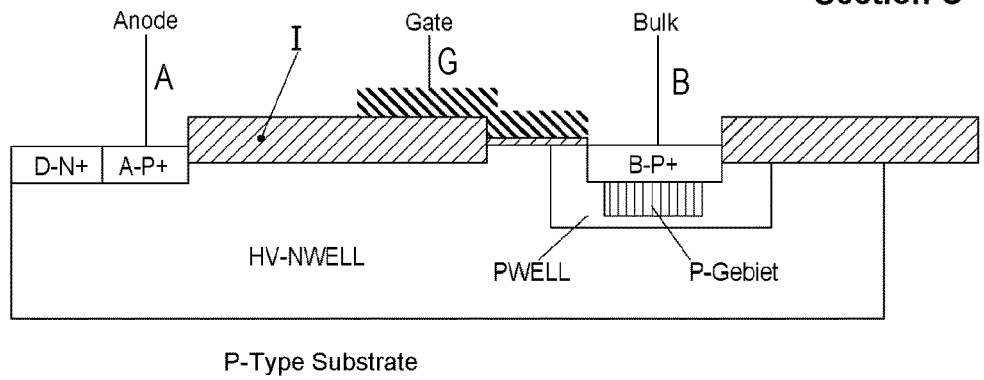
FIG. 24 shows a section through the outer region of the device of the sixth embodiment of the present invention with an additional doping of a P-well in the bulk region.

In a sixth embodiment of the device according to the present invention, which is shown in FIG. 23 and FIG. 24, an additional high-dose boron implant is introduced below the Ndiff source region S-N+ and the Pdiff bulk connection region B-P+ according to the third embodiment. This embodiment allows a particularly high increase in the trigger current $I_T^{(2)}$ of the thyristor (SCR), which is shown in FIG. 11, the reduced trigger voltage of the PNP transistor being, however, maintained.

Figure 25:
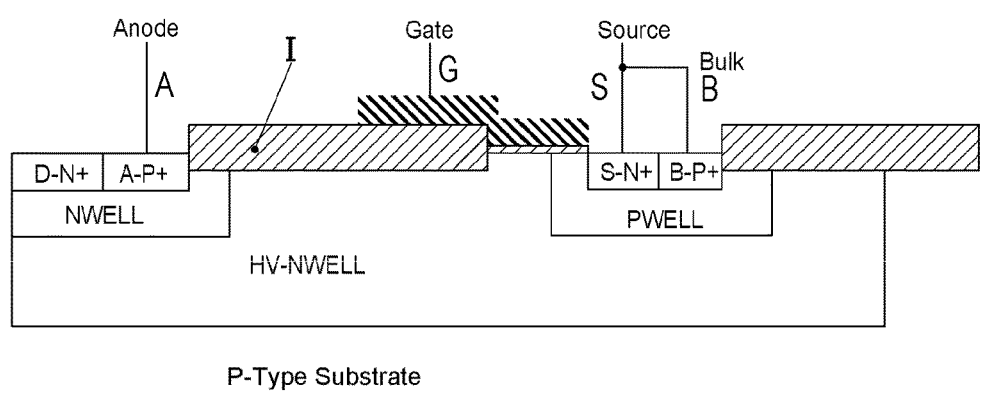
FIG. 25 shows a section through the inner region of the device of a seventh embodiment of the present invention with a second N-well in the drain extension region.
Figure 26:
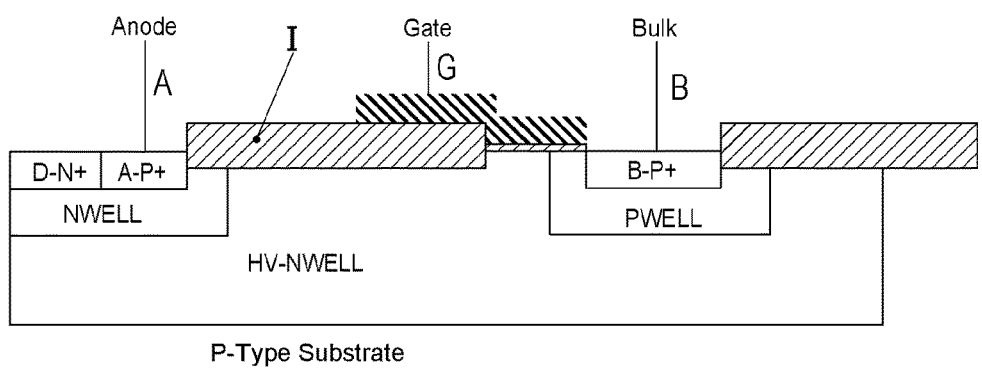
FIG. 26 shows a section through the outer region of the device of the seventh embodiment of the present invention.

In a seventh embodiment of the device, which is shown in FIG. 25 and FIG. 26, the Pdiff anode region A-P+ and the Ndiff drain diffusion region D-N+ are surrounded by an NWELL-region NWELL. This variant is advantageous for preventing a "punchthrough" (breakdown) between the Pdiff anode region A-P+ and the p-type substrate in the case of a low doped drain extension region HV-NWELL.

In an eighth embodiment of the device, the Pdiff anode region and the Ndiff drain diffusion region are additionally surrounded by an NWELL-region in a device corresponding to the sixth embodiment.

In a further embodiment, which is here not shown in the figures, the bulk region PWELL is located in the p-type substrate in a device corresponding to the third embodiment, as shown in the fourth example.

In the case of even more variants of embodiments, the respective bulk region PWELL is located in the p-type substrate in the devices corresponding to the fifth to eighth embodiments according to these variants.

Further variants of embodiments, which are here not shown in the figures, are ESD protection devices according to FIGS. 8 to 18, which are derived in the same way from depletion NLDMOS transistors. In addition, advantageous combinations of the features of the embodiments shown are possible.

In summary, the trigger current of the thyristor (SCR) comprised in the described ESD semiconductor protection device can be set according to the respective embodiment in the following way:

(1) Ratio of the width of the PNP transistor to the thyristor. Because of the higher ESD resistance per width of the thyristor compared with the PNP transistor, the thyristor can have a significantly smaller width than the PNP transistor.
(2) Drain extension region HV-NWELL (PNP base) floating or connected to p-doped anode A.
(3) Higher doping of the P-well PWELL or additional p-doping below Ndiff source S-N+− and Pdiff bulk connection region B-P+.

Between (3) and (5) point (4) is missing (5) Pdiff anode A-P+ surrounded or not surrounded by N-well NWELL.
(6) Length of the Pdiff anode A-P+ in the inner region 1 of the device and/or
(7) Exchange of Ndiff drain connection region D-N+ and Pdiff anode region A-P+ in the inner region 1 of the device.

One respective measure alone or two or more measures in combination constitute the adjustability.

LIST OF REFERENCE NUMERALS (EXTRACT)

1 inner region
2a, 2b outer region (or corner region)
$W_1$ width of the inner region
$W_{2a}$, $W_{2b}$ width of the outer region (or corner region), variable
A'-A' section in the inner region
B'-B', C'-C' sections in the outer region (or corner region)
D drain
A anode
G gate
S source
B bulk
N+ n-doped region, Ndiff region
P+ p-doped region, Pdiff region
D-N+ n-doped region at drain, Ndiff drain connection region
A-P+ p-doped region at anode, Pdiff anode region
S-N+ n-doped region at source, Ndiff source region
B-P+ p-doped region at bulk, Pdiff bulk connection region isolation region
HV-NWELL first N-well, drain extension region
PWELL P-well, bulk region
NWELL second N-well
P-resurf p-doped region
$R_{PW}$ ohmic resistance of the P-well
$R_{HVNW}$ ohmic resistance of the N-well
R ohmic resistance
$C_{GD}$ gate-drain capacitance
$V_H$ holding voltage of an SCR-LDMOS
$V_H^{(1)}$ holding voltage of the PNP transistor in a device according to an embodiment of the present invention
$V_H^{(2)}$ SCR holding voltage in a device according to an embodiment
VT trigger current of an SCR-LDMOS
$V_T^{(1)}$ trigger current of the PNP transistor in a device according to an embodiment of the present invention
$V_T^{(2)}$ SCR trigger current in a device according to an embodiment
$I_T$ trigger current of an SCR LDMOS
$I_T^{(1)}$ trigger current of the PNP transistor in a device according to an embodiment of the present invention
$I_T^{(2)}$ SCR trigger current in a device according to an embodiment

The invention claimed is:

1. A device for protection against electrostatic discharges with an at least one integrated semiconductor protection device, comprising:
an inner region configured as a thyristor (SCR); and
at least one outer region as a corner region configured as at least one PNP transistor and adapted to protect against electrostatic discharges, the inner region and the at least one outer region being arranged adjacent to one another, the at least one outer region comprising:
at least one first outer region p-doped region (A-P+) that is connected to at least one anode terminal (A);
at least one first N-well (HV-NWELL) having arranged therein at least one first outer reaion n-doped region (D-N+) and the at least one first outer reaion p-doped region (A P+);
at least one second outer region p-doped region (B-P+) having connected thereto a bulk terminal (B);
at least one P-well (PWELL) having arranged therein the at least one second outer reaion p-doped region (B-P+); and
at least one outer region isolation region (I) arranged between the at least one first outer reaion n-doped region (D-N+) and the at least one first outer reaion p-doped region (A-P+) on one side, and the at least one second outer reaion p-doped region (B-P+) on an opposite side thereof, wherein a gate terminal (G) is arranged above the at least one outer region isolation region (I);
wherein the at least one PNP transistor in the at least one outer region is configured by the at least one first outer reaion p-doped region (A-P+), the at least one first N-well (HV-NWELL) and the at least one P-well (PWELL).

2. The device according to claim 1, wherein sections of the inner region and sections of the at least one outer region, each comprising semiconductor materials, are oriented parallel to one another substantially in a direction of their longer main axis.

3. The device according to claim 2, wherein at least one outer reaion p-doped region (P-resurf) arranged between the at least one first outer reaion n-doped region (D-N+) and the at least one P-well (PWELL) is provided.

4. The device according to claim 2, wherein at least one highly doped outer reaion p-type region (H-P+) arranged in the at least one P-well (PWELL) is arranged below the at least one second outer reaion p-doped region (B-P+).

5. The device according to claim 2, wherein the at least one first outer reaion n-doped region (D-N+) and/or the at least one first outer reaion p-doped region (A-P+) is/are arranged in a second N-well (NWELL) that is arranged in a first N-well (HV-NWELL).

6. The device according to claim 2, wherein the inner region is arranged between two outer regions.

7. The device according to claim 1, wherein the inner region comprises:
   at least one first inner region n-doped region (D-N+) having connected thereto at least one inner reaion drain terminal (D);
   at least one first inner reaion p-doped region (A-P+) arranged next to the at least one first inner region n-doped region (D-N+) and having connected thereto the at least one anode terminal (terminal A);
   at least one first N-well (HV-NWELL) having arranged therein the at least one first inner region n-doped region (D-N+) and the at least one first inner region p-doped region (A-P+);
   at least one second inner reaion n-doped region (S-N+) arranged in spaced relationship with the at least one first inner reaion n-doped region (D-N+) and the at least one first inner region p-doped region (A-P+), the at least one second inner region n-doped region (S-N+) having connected thereto a source (S);
   at least one second inner reaion p-doped region (B-P+) arranged next to the at least one second inner reaion n-doped region (S-N+) and having connected thereto a bulk terminal (B);
   at least one P-well (PWELL) having arranged therein the at least one second inner reaion n-doped region (S-N+) and the at least one second inner reaion p-doped region (B-P+); and
   at least one inner region isolation region (I) arranged between the at least one first inner reaion n-doped region (D-N+) and the at least one first inner reaion p-doped region (A-P+) on one side and the at least one second inner reaion n-doped region (S-N+) on an opposite side, an inner region gate terminal (G) is arranged above the at least one inner region isolation region (I);
   wherein the thyristor in the inner region (1) is configured by the at least one first inner region p-doped region, the at least one first N-well (HV-NWELL), the at least one P-well (PWELL) and the at least one second inner region n-doped region (S-N+).

8. The device according to claim 7, comprising an MOS transistor and an integrated semiconductor protection device, a resistor being connected between a gate and a source of the MOS transistor.

9. The device according to claim 1, wherein the at least one outer region further comprises:
   a second outer region n-doped region (S-N+) arranged in spaced relationship with the at least one first outer reaion n-doped region (D-N+) and/or the at least one first outer reaion p-doped region (A-P+) and adapted to have connected thereto a source (S);
   at least one first outer region n-doped region (D-N+) adapted to have connected thereto a drain (D), and/or
   at least one outer region isolation region (I) arranged between the at least one first outer reaion n-doped region (D-N+) and/or the at least one first outer reaion p-doped region (A-P+) and the at least one second outer reaion n-doped region (S-N+) and used for receiving thereon a gate (G);
   wherein the at least one first outer region p-doped region (A-P+) is arranged next to the at least one first outer reaion n-doped region (D-N+).

10. The device according to claim 1, wherein at least one section of the at least one outer region is configured as a common section with a corresponding section of the inner region.

11. The device according to claim 1, wherein the device comprises two respective source regions (S) and two respective second n-doped regions (S-N+).

12. The device according to claim 1, wherein the at least one first outer reaion n-doped region (D-N+) is configured as a region with a floating potential.

13. The device according to claim 1, wherein a width (W2a, W2b) of the at least one outer region is greater than a width (W1) of the at least one inner region.

14. The device according to claim 1, comprising an MOS transistor and an integrated semiconductor protection device.

15. The device according to claim 14, wherein the MOS transistor is configured as a depletion field effect transistor.

16. The device according to claim 14, wherein the MOS transistor has a gate connection, a source connection, a drain connection, and a bulk connection, and the drain connection is short-circuited with the at least one anode terminal.

17. The device according to claim 1, wherein the at least one PNP transistor triggers in the corner regions prior to the thyristor in the inner region (1) when an ESD pulse occurs, and acts as a first ESD protection stage having a high holding voltage, the high holding voltage being higher than half of a trigger voltage.

18. The device according to claim 1, wherein ignition of the thyristor in the inner region, and thus a thyristor-typical low holding voltage, will only take place at higher currents, these higher currents being currents of at least 200 mA.

* * * * *